(12) United States Patent
Nishiyama

(10) Patent No.: US 10,720,908 B2
(45) Date of Patent: Jul. 21, 2020

(54) CONTROL CIRCUIT AND CONTROL METHOD

(71) Applicant: FUJITSU LIMITED, Kawasaki-shi (JP)

(72) Inventor: Ryuichi Nishiyama, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/695,264

(22) Filed: Nov. 26, 2019

(65) Prior Publication Data

US 2020/0204164 A1 Jun. 25, 2020

(30) Foreign Application Priority Data

Dec. 20, 2018 (JP) ................................ 2018-238167

(51) Int. Cl.
| | |
|---|---|
| *H03K 3/00* | (2006.01) |
| *H03K 5/00* | (2006.01) |
| *G06F 1/32* | (2019.01) |
| *H03K 3/011* | (2006.01) |
| *H03K 5/133* | (2014.01) |

(52) U.S. Cl.
CPC ............. *H03K 3/011* (2013.01); *H03K 5/133* (2013.01); *H03K 2005/00019* (2013.01); *H03K 2005/00195* (2013.01)

(58) Field of Classification Search
CPC ................... H03K 3/011; H03K 5/133; H03K 2005/00019; H03K 2005/00195
See application file for complete search history.

(56) References Cited

U.S. PATENT DOCUMENTS

| | | | | |
|---|---|---|---|---|
| 7,577,862 | B2* | 8/2009 | McClendon | G06F 1/206 713/300 |
| 8,405,413 | B2* | 3/2013 | Carpenter | G01R 31/31725 324/750.3 |
| 8,497,694 | B2* | 7/2013 | Chua-Eoan | G01R 31/31721 324/750.15 |
| 9,342,132 | B2* | 5/2016 | Rusu | G06F 1/324 |
| 9,564,883 | B1* | 2/2017 | Quinton | H03K 5/13 |
| 9,565,036 | B2* | 2/2017 | Zerbe | H04L 25/0264 |
| 9,760,672 | B1* | 9/2017 | Taneja | G06F 30/398 |
| 10,013,045 | B2* | 7/2018 | Rusu | G06F 1/206 |

(Continued)

FOREIGN PATENT DOCUMENTS

| | | |
|---|---|---|
| JP | 08-265118 | 10/1996 |
| JP | 2007-312194 | 11/2007 |

(Continued)

*Primary Examiner* — Kenneth B Wells
(74) *Attorney, Agent, or Firm* — Fujitsu Patent Center

(57) ABSTRACT

A noise detection circuit includes a first delay circuit which has a propagation delay of a first delay time when a signal propagates therethrough and a second delay circuit which has a propagation delay of a second delay time when the signal propagates therethrough, and outputs, based on a sum of the first delay time and the second delay time, a detection result indicating the magnitude of noise on power supply voltage applied to the first delay circuit and the second delay circuit. A control unit controls, based on the detection result, a frequency of a clock signal supplied to a circuit unit to which the power supply voltage is applied and the second delay time in such a manner as to exhibit an opposite behavior to a change in the first delay time induced by temperature.

7 Claims, 10 Drawing Sheets

(56) References Cited

U.S. PATENT DOCUMENTS

| | | | |
|---|---|---|---|
| 10,084,437 B1 * | 9/2018 | Chen | G01R 29/26 |
| 10,320,430 B2 * | 6/2019 | Srivastava | H04B 1/04 |
| 2007/0268167 A1 | 11/2007 | Ide | |
| 2008/0186001 A1 | 8/2008 | Singh et al. | |
| 2016/0380641 A1 | 12/2016 | Hashimoto | |

FOREIGN PATENT DOCUMENTS

| | | |
|---|---|---|
| JP | 2008-193080 | 8/2008 |
| JP | 2016-111563 | 6/2016 |
| JP | 2017-17671 | 1/2017 |

* cited by examiner

_US 10,720,908 B2_

CONTROL CIRCUIT AND CONTROL METHOD

CROSS-REFERENCE TO RELATED APPLICATION

This application is based upon and claims the benefit of priority of the prior Japanese Patent Application No. 2018-238167, filed on Dec. 20, 2018, the entire contents of which are incorporated herein by reference.

FIELD

The embodiments discussed herein are related to a control circuit and control method.

BACKGROUND

Power supply noise (also sometimes called simultaneous switching noise) may occur in a semiconductor integrated circuit, such as a large scale integrated circuit (LSI) when there is a significant change in computational load or the number of circuits running amongst a plurality of circuits included in the semiconductor integrated circuit. When power supply noise has occurred, a power supply voltage drop may lead to insufficient voltage supply to the circuits in the semiconductor integrated circuit. This could increase the propagation delay time (hereinafter referred to simply as delay time) of a signal propagating through the semiconductor integrated circuit, thus causing timing errors.

There are conventionally proposed adaptive clocking control (ACC) circuits used to avoid timing errors caused by power supply noise (see, for example, Japanese Laid-open Patent Publication No. 2017-17671). Such an ACC circuit monitors the power supply voltage to detect a drop in the power supply voltage, using a power supply noise monitor. If the power supply voltage falls at or below a predetermined threshold, the ACC circuit reduces the frequency of a clock signal supplied to circuits in a semiconductor integrated circuit, to thereby avoid timing errors. In the case of using no ACC circuit, the clock frequency is determined in consideration of timing errors occurring when power supply noise generated inside the semiconductor integrated circuit reaches its maximum; however, such a determination need not be made when the ACC circuit is used.

Some power supply noise monitors used in ACC circuits take advantage of the change in signal delay time resulting from power supply noise. Critical path monitors (CPM) are one example of such power supply noise monitors. A CPM includes, for example, a delay circuit with a delay time equal to that of a path in a semiconductor integrated circuit, with the largest delay (such a path is called a critical path). In order to output a value representing the magnitude of power supply noise, the CPM takes advantage of the setup margin of a flip-flop to which a signal is transmitted, being reduced due to an increased delay time of the delay circuit caused by a drop in the power supply voltage.

There are conventionally proposed techniques for correcting, according to temperature, the frequency of a clock signal output from a temperature-dependent oscillator (see, for example, Japanese Laid-open Patent Publication No. 2007-312194). There are also conventionally known techniques for keeping a gate delay time constant by preliminarily tabulating results of measuring change characteristics of the gate delay time in relation to temperature and power supply voltage and then changing the power supply voltage based on the prepared table and a device temperature (see, for example, Japanese Laid-open Patent Publication No. 08-265118).

As for power supply noise monitors using the change in delay time resulting from power supply noise, the delay time is also affected by temperature. Therefore, in the case of controlling the frequency of a clock signal using such a power supply noise monitor, there remains a problem that temperature dependence of the delay time reduces accuracy in controlling the frequency of the clock signal.

SUMMARY

According to one aspect, there is provided a control circuit including a noise detection circuit configured to include a first delay circuit which has a propagation delay of a first delay time when a signal propagates therethrough and a second delay circuit which has a propagation delay of a second delay time when the signal propagates therethrough, and configured to output, based on a sum of the first delay time and the second delay time, a detection result indicating magnitude of noise on power supply voltage applied to the first delay circuit and the second delay circuit; and a control unit configured to control, based on the detection result, a frequency of a clock signal supplied to a circuit unit to which the power supply voltage is applied and the second delay time in such a manner as to exhibit an opposite behavior to a change in the first delay time induced by temperature.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Several embodiments will be described below with reference to the accompanying drawings.

(a) First Embodiment

Figure 1:
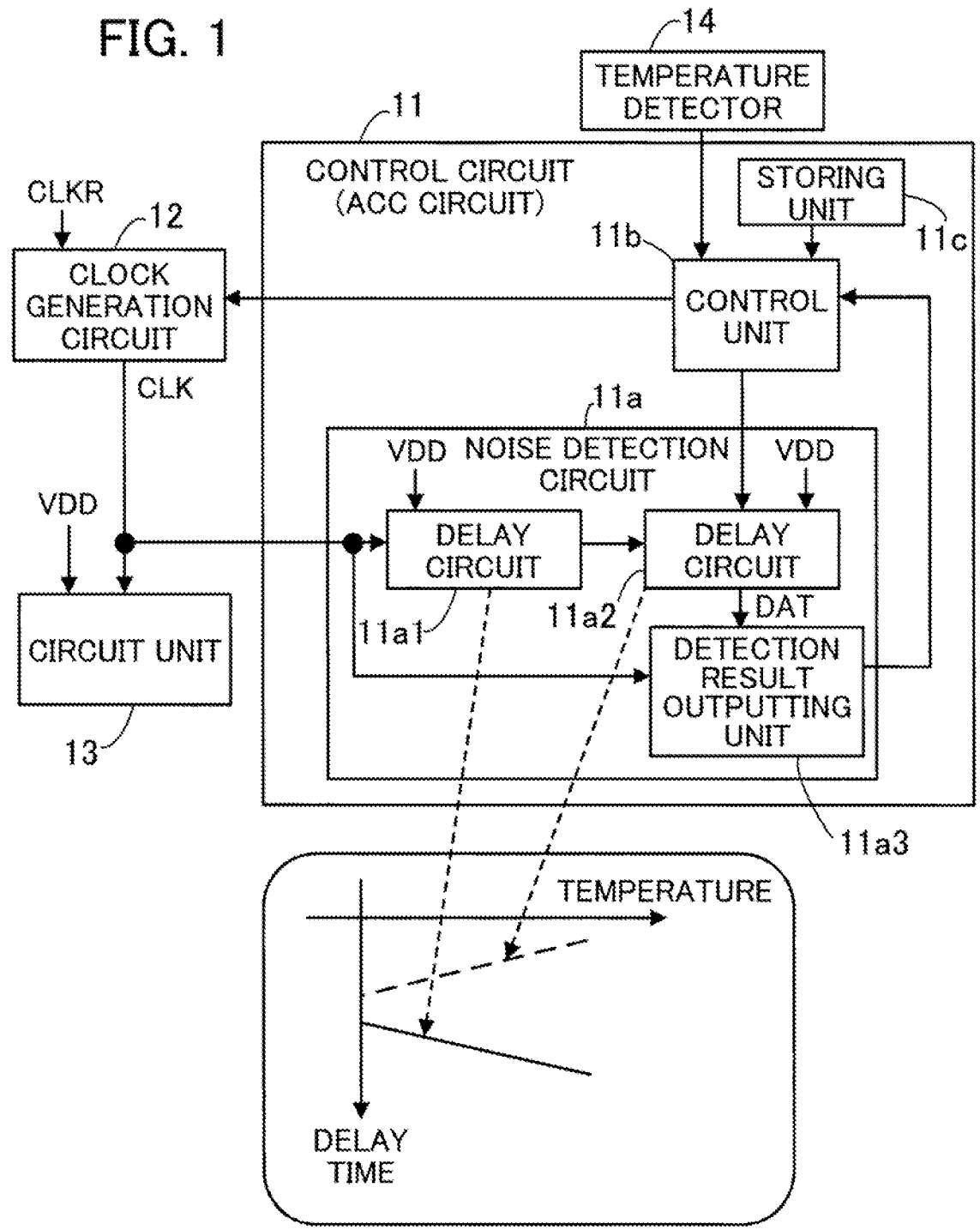
FIG. 1 illustrates an exemplary semiconductor integrated circuit including a control circuit according to a first embodiment.

FIG. 1 illustrates an exemplary semiconductor integrated circuit including a control circuit according to a first embodiment.

A semiconductor integrated circuit 10 includes a control circuit 11 (hereinafter referred to as the ACC circuit 11) of the first embodiment, a clock generation circuit 12, a circuit unit 13, and a temperature detector 14.

The ACC circuit 11 includes a noise detection circuit 11a, a control unit 11b, and a storing unit 11c.

The noise detection circuit 11a includes delay circuits 11a1 and 11a2 to which a power supply voltage VDD is applied. The delay circuits 11a1 and 11a2 produce delay times when receiving a signal (a clock signal CLK in the example of FIG. 1). Each of their delay times changes depending on the magnitude of noise on the power supply voltage VDD (power supply noise). The higher the power supply noise (i.e., larger the drop in.. the power supply voltage VDD), the larger the delay becomes. The delay circuit 11a1 is, for example, a plurality of inverters (or buffers) connected in series, or a replica of a critical path determined in the semiconductor integrated circuit 10 (or a circuit with a delay time equal to that of the critical path). The delay time of the delay circuit 11a2 is controlled by the control unit 11b.

The noise detection circuit 11a outputs, based on the sum of the delay times of the individual delay circuits 11a1 and 11a2, a detection result indicating the magnitude of the power supply noise.

In the example of FIG. 1, the noise detection circuit 11a includes a detection result outputting unit 11a3. The detection result outputting unit 11a3 receives the clock signal CLK, the time obtained as the sum of the aforementioned delay times, and a signal DAT generated by delaying the clock signal CLK, and outputs the detection result indicating the magnitude of the power supply noise corresponding to the delay time difference between the clock signal CLK and the signal DAT.

The control unit 11b controls, based on the detection result output from the noise detection circuit 11a, the frequency of the of signal CLK supplied to the circuit unit 13, to which the power supply voltage VDD is applied. The control unit 11b transmits, to the clock generation circuit 12, a control signal based on the detection result to thereby control the frequency of the clock signal CLK.

For example, the control unit 11b determines, based on the detection result, whether the power supply voltage VDD has dropped to a threshold. Then, when determining that the power supply voltage VDD has fallen to the threshold, the control unit 11b causes the clock generation circuit 12 to start reducing the frequency of the clock signal CLI. The threshold is set to a value higher, by a predetermined voltage, than a lower voltage limit at which no timing errors occur in the circuit unit 13, in consideration of delay time taken for the frequency of the clock signal CLK to be reduced to a predetermined level. The difference between the lower voltage limit and the threshold is referred to as a guard band.

Note that, for example, in release testing of the semiconductor integrated circuit 10, the frequency of the clock signal CLK at which no timing errors occur is determined in advance based on circuit delay in the circuit unit 13 caused by power supply noise. When exercising ACC (i.e., reducing the frequency of the clock signal CLK), the ACC circuit 11 reduces the frequency of the clock signal CLK, for example, to the predetermined frequency.

Further, the control unit 11b controls the delay time of the delay circuit 11a2 in such a manner as to exhibit an opposite behavior to a change in the delay time of the delay circuit 11a1 induced by temperature. For example, in the case where the delay time of the delay circuit 11a1 increases with increasing temperature, the control unit 11b shortens the delay time of the delay circuit 11a2 with increasing temperature, as illustrated in FIG. 1.

The storing unit 11c stores therein in advance, for example, mapping information indicating mappings between temperature values and control values used to control the delay time of the delay circuit 11a2 (hereinafter referred to as the temperature correction codes). The mapping information is hereinafter referred to as the temperature correction code table. The temperature correction codes are adjusted such that, for example, the sum of the delay times of the delay circuits 11a1 and 11a2 at each temperature reading takes a constant value when the power supply voltage VDD is at the aforementioned threshold voltage. Note that the constant value is less than a summed delay time determined to cause timing errors.

The control unit 11b acquires a temperature reading from the temperature detector 14, then reads, from the storing unit 11c, a temperature correction code corresponding to the acquired temperature reading, and controls the delay time of the delay circuit 11a2 according to the read temperature correction code. For example, the control unit 11b requests the temperature detector 14 at predetermined time intervals for sending temperature information indicating a temperature reading, and then receives the temperature information at predetermined time intervals. Alternatively, the control unit 11b may continuously monitor temperature detected by the temperature detector 14. Then, if the monitored temperature matches a temperature value listed in the temperature correction code table, the control unit 11b may read a temperature correction code corresponding to the temperature value from the storing unit 11c.

Note that the temperature correction code table is generated, for example, at the time of designing the semiconductor integrated circuit 10, or assessment using test chips for evaluating the semiconductor integrated circuit 10, and then written to the storing unit 11c.

The control unit 11b is implemented on a hardware platform, such as a processor or an electronic circuit designed for specific use (e.g. an application specific integrated circuit (ASIC) or a field programmable gate array (FPGA)). Alternatively, the control unit 11b may be implemented with a combination of these.

The storing unit 11c stores therein the temperature correction code table. In the case where the control unit 11b is implemented using a processor, the storing unit 11c may also store a control program to be executed by the processor. The storing unit 11c is, for example, a non-volatile memory device such as flash memory. Note that the control program may be stored in memory external to the ACC circuit 11.

The clock generation circuit 12 generates the clock signal CLK, and also changes the frequency of the clock signal CLK based on the control signal supplied by the control unit 11b. The clock generation circuit 12 is, for example, a phase locked loop (PLL) circuit or delay locked loop (DLL) circuit. The following assumes that the clock generation circuit 12 is a PLL circuit. The PLL circuit outputs the clock signal CLK having a frequency equal to an integral multiple of the frequency of a reference clock signal CLKR. It is possible to change the frequency of the clock signal CLK by changing the frequency division ratio of a frequency divider included in the PLL circuit based on the control signal supplied by the control unit 11b.

The circuit unit 13 receives the power supply voltage VDD, and operates in synchronization with the clock signal CLK. The circuit unit 13 includes, for example, logic circuits including various computing elements, and random access memory (RAM).

The temperature detector 14 detects a temperature. The temperature detector 14 is disposed adjacent to the delay circuits 11a1 and 11a2 whose delay times are affected by temperature. For example, the temperature detector 14 converts the detected temperature into digital temperature information and transmits the information to the control unit 11b. The temperature detector 14 is implemented, for example, using a temperature sensor element such as a diode.

Next described are examples of operations carried out by the ACC circuit 11 according to the first embodiment. Note that the following separately describes an operation performed when the control unit 11b receives a detection result indicating the magnitude of power supply noise from the noise detection circuit 11a and an operation performed when the control unit 11b receives temperature information from the temperature detector 14.

Figure 2:
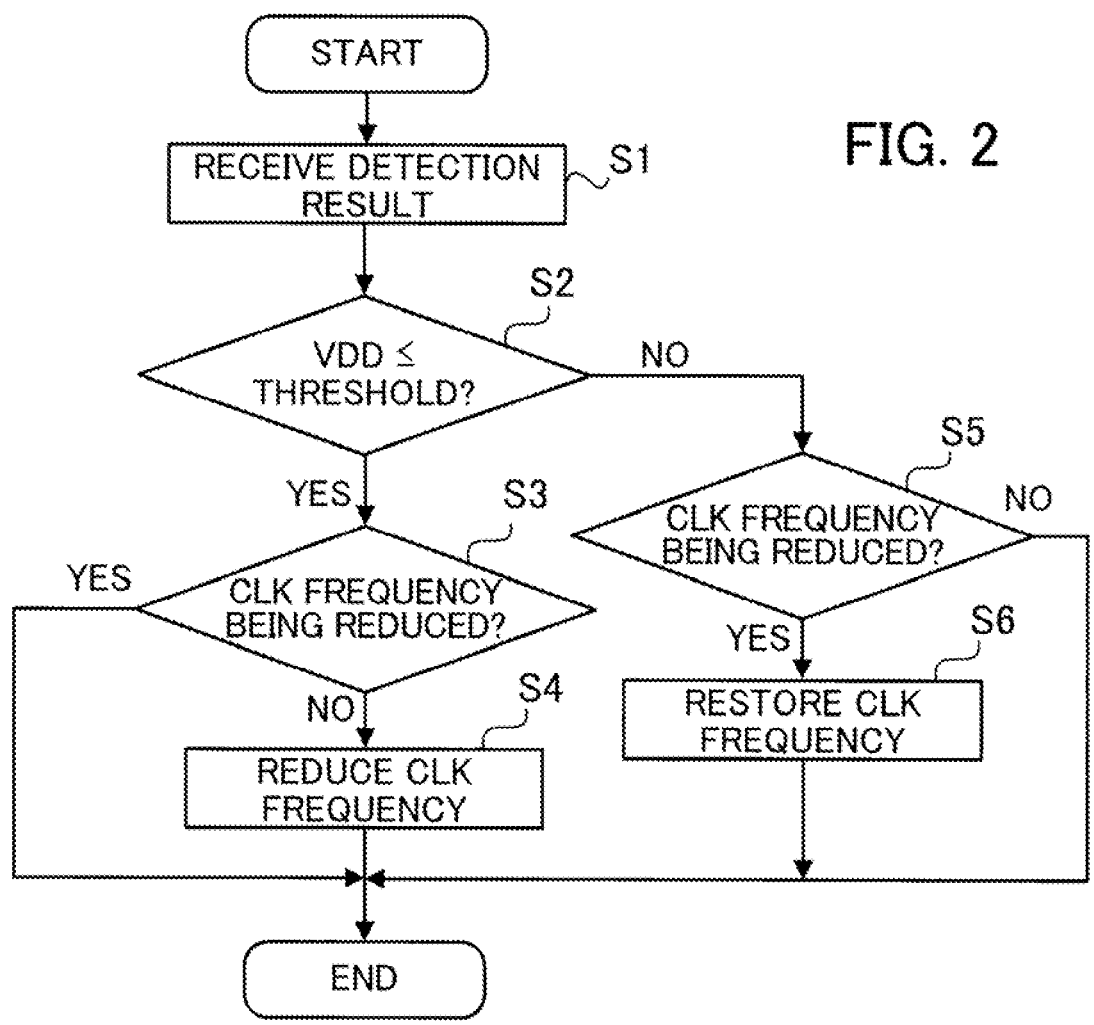
FIG. 2 is a flowchart illustrating an exemplary flow of a method of controlling a frequency of a clock signal, used by an ACC circuit according to the first embodiment.

FIG. 2 is a flowchart illustrating an exemplary flow of a method of controlling the frequency of the clock signal, used by the ACC circuit according to the first embodiment.

The control unit 11b performs the following processing, for example, each time a detection result indicating the magnitude of power supply noise is received from the noise detection circuit 11a.

Upon receiving a detection result (step S1), the control unit 11b determines whether the power supply voltage VDD is equal to or less than a threshold, based on the detection result (step S2). If determining that the power supply voltage VDD is equal to or less than the threshold, the control unit 11b determines whether the frequency of the clock signal CLK is being reduced (step S3). If determining that the frequency of the clock signal CLK is not being reduced, the control unit 11b reduces the frequency of the clock signal CLK to a predetermined level (step S4).

After step S4 or when determining, in step S3, that the frequency of the clock signal CLK is being reduced, the control unit 11b ends the processing started upon the reception of the detection result in step S1.

If determining, in step S2, that the power supply voltage VDD is not equal to or less than the threshold, the control unit 11b determines whether the frequency of the clock signal CLK is being reduced (step S5). If determining that the frequency of the clock signal CLK is being reduced, the control unit 11b restores the frequency of the clock signal CLK (step S6). Because a sharp rise in the frequency of the clock signal CLK may cause noise, the control unit 11b increases the frequency of the clock signal CLK, for example, in stages.

After step S6 or when determining, in step S5, that the frequency of the clock signal CLK is not being reduced, the control unit 11b ends the processing started upon the reception of the detection result in step S1.

Figure 3:
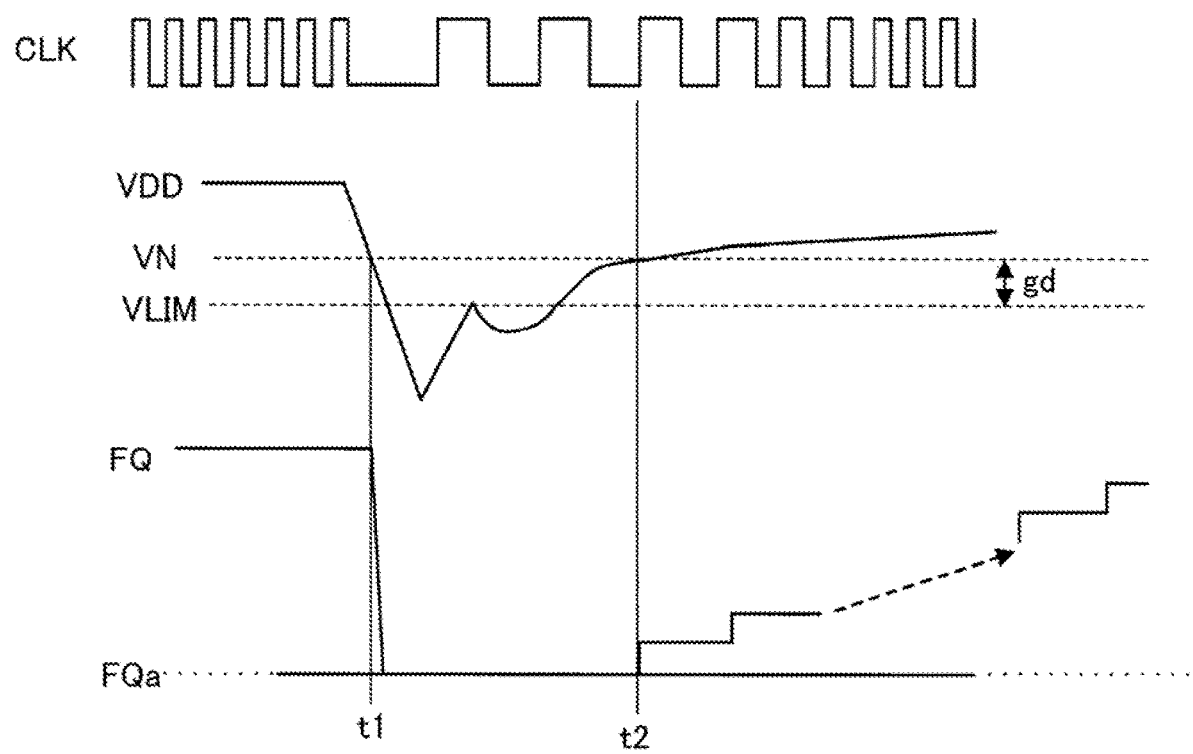
FIG. 3 is a waveform diagram representing exemplary control of the frequency of the clock signal, exercised by the ACC circuit.

FIG. 3 is a waveform diagram representing exemplary control of the frequency at the clock signal, exercised by the ACC circuit.

FIG. 3 illustrates exemplary time changes in the clock signal CLK, the power supply voltage VDD, and frequency FQ of the clock signal CLK.

A voltage VLIM is a lower limit of the power supply voltage VDD, for example, causing no timing errors in the circuit unit 13 of FIG. 1. Timing errors occur when the power supply voltage VDD falls below the voltage VLIM.

A threshold voltage VN is set to a value higher than the voltage VLIM by a predetermined voltage gd (also called a guard band).

In the example of FIG. 3, when the power supply voltage VDD drops to the threshold voltage VN (time t1), the frequency FQ of the clock signal CLK starts being reduced and then drops to a predetermined frequency level FQa. When the power supply voltage VDD starts recovering and then exceeds the threshold voltage VN (time T2), the frequency FQ of the clock signal CLK starts rising. In the example of FIG. 3, the frequency FQ is increased in a stepwise fashion.

Figure 4:
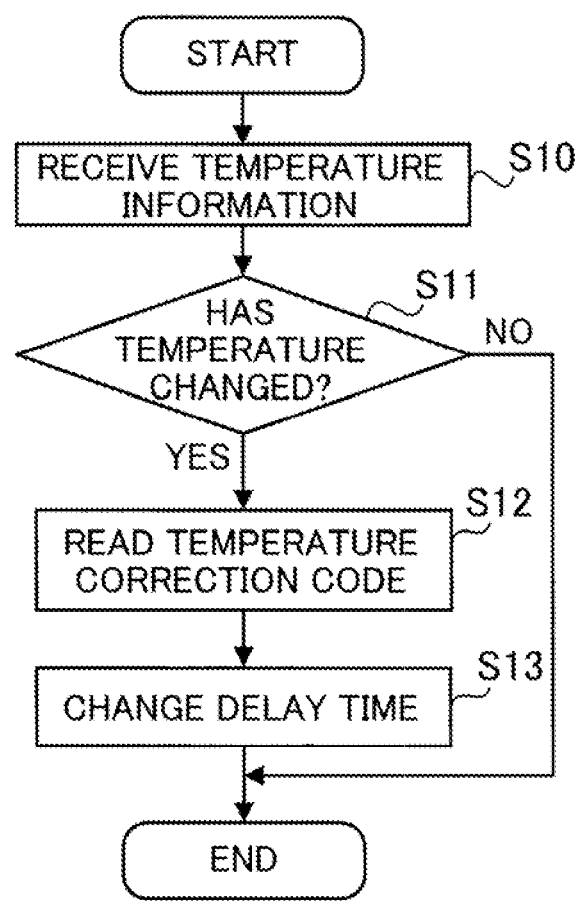
FIG. 4 is a flowchart illustrating an exemplary method of controlling a delay time of a noise detection circuit, exercised in the ACC circuit according to the first embodiment.

FIG. 4 is a flowchart illustrating an exemplary method of controlling a delay time of the noise detection circuit, exercised in the ACC circuit according to the first embodiment.

The control unit 11b performs the following processing, for example, each time temperature information is received from the temperature detector 14.

Upon receiving temperature information from the temperature detector 14 (step S10), the control unit 11b determines whether the temperature has changed, based on the temperature information (step S11). The control unit 11b refers to the temperature correction code table to determine that the temperature has changed, for example, if the received temperature information indicates a temperature different from one corresponding to a temperature correction code currently applied to the delay circuit 11a2.

When determining that the temperature has changed, the control unit 11b reads, from the storing unit 11c, a temperature correction code corresponding to the temperature indicated by the temperature information (step S12). Then, the control unit 11b changes the delay time of the delay circuit 11a2 according to the read temperature correction code (step S13). As described above, the control unit 11b controls the delay time of the delay circuit 11a2 in such a manner as to exhibit an opposite behavior to a change in the delay time of the delay circuit 11a1 induced by temperature. When determining that the temperature has not changed, or after step S13, the control unit 11b ends the delay time control processing started upon the reception of the temperature information in step S10.

As described above, the control unit 11b controls the delay time of the delay circuit 11a2 in such a manner as to exhibit an opposite behavior to a change in the delay time of the delay circuit 11a1 induced by temperature. Herewith, it is possible to exercise control over the temperature dependence of the overall (i.e., summed) delay time of the entire noise detection circuit 11a.

If no control is exercised over the temperature dependence of the overall delay time of the noise detection circuit 11a, the threshold voltage VN depicted in FIG. 3 would actually vary with temperature. This is because it is determined that power supply noise lager then it actually is has occurred, for example, when rise in temperature results in increased delay time.

According to the ACC circuit 11 of the first embodiment, the temperature dependence of the overall delay time of the noise detection circuit 11a is controlled, which in turn controls variations in the threshold voltage VN with temperature changes. This provides greater control accuracy of the control unit 11b in controlling the frequency of the clock signal CLK.

Note that when no control is exercised over the temperature dependence of the overall delay time of the noise detection circuit 11a, it may be considered reasonable to set the threshold voltage VN high in consideration of variations in the threshold voltage VN with temperature. In that case, however, ACC would be exercised even for relatively low power supply noise that does not cause timing errors, which results in all too frequent reductions of the frequency of the clock signal CLK. This may lead to longer computing time of the circuit unit 13.

The ACC circuit 11 of the first embodiment controls variations in the threshold voltage VN with temperature, which allows an appropriate setting of the threshold voltage VN. As a result, it is possible to avoid all too frequent reductions of the frequency of the clock signal CLK.

Note that, in the above description, the clock generation circuit 12 changes the frequency of the clock signal CLK based on the control signal supplied by the control unit 11b; however, the applicable scope of the technology according to the first embodiment is not limited to this example. Alternatively, it may be configured that the control unit 11b receives the clock signal CLK output from the clock generation circuit 12 and then changes the frequency of the received clock signal CLK.

In addition, the control unit 11b may be provided with separate control circuits, one for controlling the frequency of the clock signal CLK and the other for controlling the delay time of the delay circuit 11a2.

Further, each of the noise detection circuit 11a and the temperature detector 14 may be provided in plurality. For example, it may be configured that noise detection circuits are arranged at a plurality of locations in the circuit unit 13 and a temperature detector is disposed adjacent to each of these noise detection circuits. In this case, for example, the control unit 11b controls the delay time of the delay circuit of each noise detection circuit based on the temperature detected by the temperature detector placed adjacent to the noise detection circuit. In addition, the control unit 11b receives detection results output from the individual noise detection circuits, and starts reducing the frequency of the clock signal CLK when the detection result output from any of the noise detection circuits indicates that the power supply voltage VDD has dropped to the threshold.

(b) Second Embodiment

Figure 5:
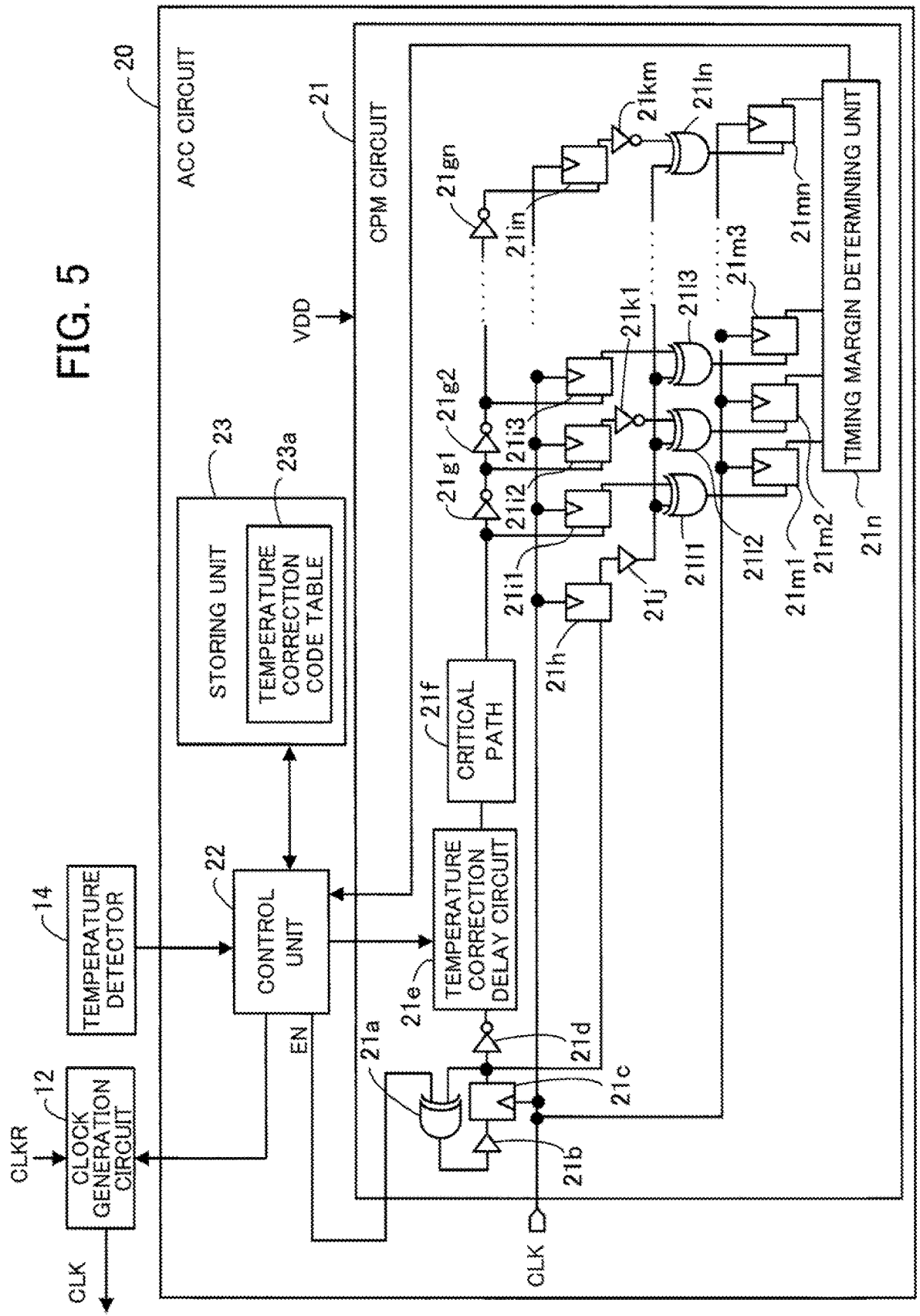
FIG. 5 illustrates an exemplary ACC circuit according to a second embodiment.

FIG. 5 illustrates an exemplary ACC circuit according to a second embodiment.

An ACC circuit 20 of the second embodiment includes a CPM circuit 21, which is an example of a noise detection circuit, a control unit 22, and a storing unit 23.

The CPM circuit 21 includes an exclusive OR (ExOR) circuit 21a, a buffer 21b, a flip-flop 21c, an inverter 21d, a temperature correction delay circuit 21e, a critical path 21f, and inverters 21g1, 21g2, . . . , and 21gn. The CPM circuit 21 also includes flip-flops 21h, 21i1, 21i2, 21i3, . . . , and 21in, a buffer 21j, inverters 21k1 to 21km, and ExOR circuits 21/1, 21/2, 21/3, . . . , and 21/n. The CPM circuit 21 further includes flip-flops 21m1, 21m2, 21m3, . . . , and 21mn, and a timing margin determining unit 21n.

As for the ExOR circuit 21a, an enable signal EN is supplied by the control unit 22 to one input terminal thereof, and an output signal of the flip-flop 21c is supplied to the other input terminal. An output terminal of the ExOR circuit 21a is connected to an input terminal of the buffer 21b, whose output terminal is connected to a data input terminal of the flip-flop 21c. The clock signal CLK is supplied to a clock terminal of the flip-flop 21c, whose output terminal is connected to an input terminal of the inverter 21d.

An output terminal of the inverter 21d is connected to an input terminal of the temperature correction delay circuit 21e, whose output terminal is connected to an input terminal of the critical path 21f. An output terminal of the critical path 21f is connected to an input terminal of the inverter 21g1 in the first stage amongst the inverters 21g1, 21g2, . . . , and 21gn connected in series in a plurality of stages, as well as to a data input terminal of the flip-flop 21i1.

An output terminal of each of the inverters 21g1 to 21gn is connected to a data input terminal of one of the flip-flops 21i2 to 21in. The clock signal CLK is supplied to clock input terminals of the flip-flops 21h, and 21i1 to 21in. An output terminal of the flip-flop 21h is connected to one input terminal of each of the ExOR circuits 21/1 to 21/n via the buffer 21j.

As for, amongst the flip-flops 21i1 to 21in, each flip-flop whose data input terminal receives an output signal of the critical path 21f via none or an even number of inverters, an output signal of the flip-flop is supplied to the other input terminal of one of the ExOR circuits 21/1 to 21/n. For example, the output signal of the flip-flop 21i1 is supplied to the other input terminal of the ExOR circuit 21/1, and the output signal of the flip-flop 21i3 is supplied to the other input terminal of the ExOR circuit 21/3.

On the other hand, as for, amongst the flip-flops 21i1 to 21in, each flip-flop whose data input terminal receives an output signal of the critical path 21f via an odd number of inverters, an output signal of the flip-flop is supplied to the other input terminal of one of the ExOR circuits 21/1 to 21/n via an inverter. For example, the output signal of the flip-flop 21i2 is supplied to the other input terminal of the ExOR circuit 21/2 via the inverter 21k1, and the output signal of the flip-flop 21in is supplied to the other input terminal of the ExOR circuit 21/n via the inverter 21km.

The output signal of each of the ExOR circuits 21/1 to 21/n is supplied to a data input terminal of one of the flip-flops 21m1 to 21mn. The clock signal CLK is supplied to clock input terminals of the flip-flops 21m1 to 21mn. Output signals of the flip-flops 21m1 to 21mn are supplied to the timing margin determining unit 21n.

Note that the power supply voltage VDD is applied to each element in the CPM circuit 21.

In the CPM circuit 21 described above, when the initial value of the flip-flop 21c is 0 and the enable signal EN supplied by the control unit 22 changes from 0 to 1, the output signal of the flip-flop 21c becomes 1 in synchronization with the clock signal CLK. Thereafter, the output signal of the flip-flop 21c repeatedly changes between 0 and 1 in synchronization with the clock signal CLK.

The delay time of the temperature correction delay circuit 21e is controlled by the control unit 22, as with the delay time of the delay circuit 11a2 illustrated in FIG. 1.

The critical path 21f is a replica of a path with the maximum delay time (a critical path) of a semiconductor integrated circuit on which the ACC circuit 20 is provided, or a circuit with a delay time equal to that of the critical path. The critical path 21f has the same functions as those of the delay circuit 11a1 of FIG. 1.

The inverters 21g1 to 21gn and 21k1 to 21km, the flip-flops 21h, 21i1 to 21in, and 21m1 to 21mn, the buffer 21j, the ExOR circuits 21/1 to 21/n, and the timing margin determining unit 21n serve the functions of the detection result outputting unit 11a3 of FIG. 1.

The timing margin determining unit 21n outputs a detection result corresponding to the difference in the delay time between the clock signal CLK and the output signal of the flip-flop 21c delayed by the temperature correction delay circuit 21e and the critical path 21f.

In the above-described CPM circuit 21, high power supply noise results in long delay time at the temperature correction delay circuit 21e and the critical path 21f and, then, an increased rate of output signals having a value of 0 among the output signals of the individual flip-flops 21m1 to 21mn. Based on the rate of the output signals having a value of 0 (or the rate of output signals having a value of 1) among the output signals of the flip-flops 21m1 to 21mn, the timing margin determining unit 21n outputs a detection result indicating the magnitude of the power supply noise.

The control unit 22 has the same functions as the control unit 11b of FIG. 1. That is, the control unit 22 controls the frequency of the clock signal CLK based on the detection result output from the CPM circuit 21. In addition, the control unit 22 controls the delay time of the temperature correction delay circuit 21e in such a manner as to exhibit an opposite behavior to a change in the delay time of the critical path 21f induced by temperature.

For example, the control unit 22 acquires a temperature reading from the temperature detector 14, then reads, from the storing unit 23, a temperature correction code corresponding to the acquired temperature reading, and controls the delay time of the temperature correction delay circuit 21e according to the read temperature correction code.

The control unit 22 is implemented on a hardware platform, such as a processor or an electronic circuit designed for specific use (e.g. an ASIC or FPGA). Alternatively, the control unit 22 may be implemented with a combination of these.

The storing unit 23 stores therein a temperature correction code table 23a. In the case where the control unit 22 is implemented using a processor, the storing unit 23 may also store a control program to be executed by the processor. The storing unit 23 is, for example, non-volatile memory device such as flash memory.

Figure 6:
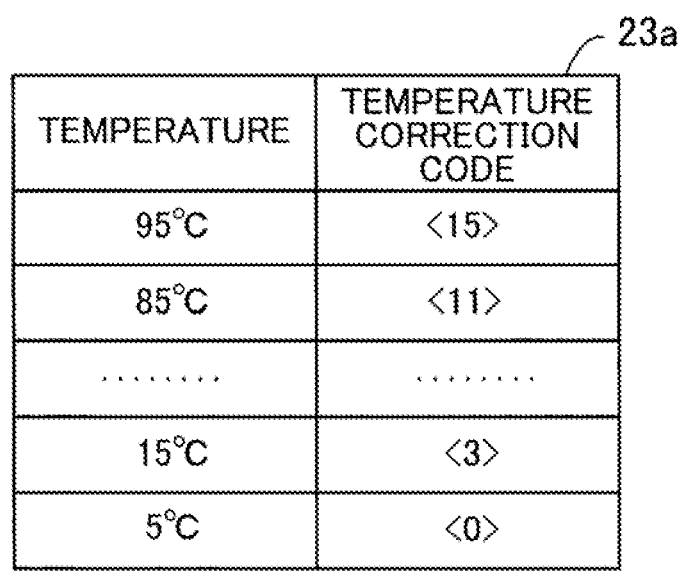
FIG. 6 illustrates an exemplary temperature correction code table.

FIG. 6 illustrates an exemplary temperature correction code table.

The temperature correction code table 23a is information indicting mappings between temperature values and temperature correction codes used to control the delay time of the temperature correction delay circuit 21e. In FIG. 6, for example, a temperature of 5° C. is associated with a temperature correction code of <0>, and a temperature of 95° C. is associated with a temperature correction code of <15>. A temperature correction code associated with a higher temperature is used to make the delay time of the temperature correction delay circuit 21e shorter.

Figure 7:
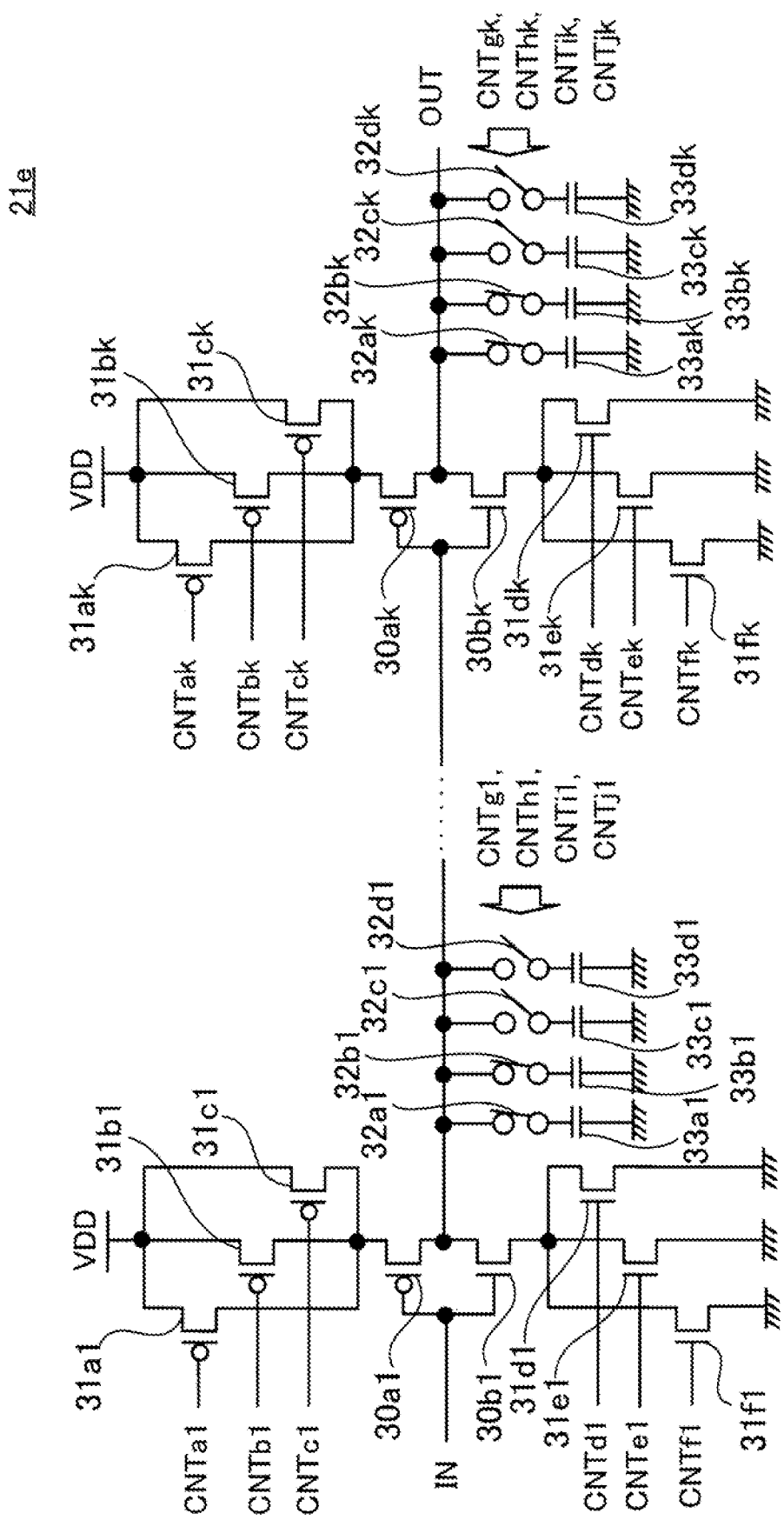
FIG. 7 illustrates an exemplary temperature correction delay circuit.

FIG. 7 illustrates an exemplary temperature correction delay circuit.

In the temperature correction delay circuit 21e, inverters each including a p-channel MOSFET (metal-oxide-semiconductor field-effect transistor) (hereinafter abbreviated to "pMOS") and an n-channel MOSFET ("nMOS") are connected in series in k stages, where k is an even number equal to or greater than 2. Note however that k may be an odd number if, in the CPM circuit 21 of FIG. 5, an inverter is added to the input or output terminal of the temperature correction delay circuit 21e. As illustrated in FIG. 7, the first-stage inverter is implemented, for example, with a pMOS 30a1 and an nMOS 30b1 whose gates receive a signal IN and whose drains are connected to each other. In addition, the last-stage inverter that outputs a signal OUT is implemented with a pMOS 30ak and an nMOS 30bk whose gates receive an output signal of an inverter in the preceding stage and whose drains are connected to each other.

Further, in the temperature correction delay circuit 21e, a plurality of pMOSs is connected to the source of the pMOS of at least one inverter, and a plurality of nMOSs is connected to the source of the nMOS of at least one inverter. The drive capability of the inverter is adjusted by turning on or off these pMOSs and nMOSs using control signals supplied by the control unit 22.

As illustrated in FIG. 7, for example, the drains of pMOSs 31a1, 31b1, and 31c1 are connected to the source of the pMOS 30a1, and the drains of pMOSs 31ak, 31bk, and 31ck are connected to the source of the pMOS 30ak. In addition, the drains of nMOSs 31d1, 31e1, and 31f1 are connected to the source of the nMOS 30b1, and the drains of nMOSs 31dk, 31ek, and 31fk are connected to the source of the nMOS 30bk. The power supply voltage VDD is applied to the sources of the pMOSs 31a1, 31b1, 31c1, 31ak, 31bk, and 31ck, and the sources of the nMOSs 31d1, 31e1, 31f1, 31dk, 31ek, and 31fk are grounded.

Each control signal CNTa1 to CNTak, CNTb1 to CNTbk, CNTc1 to CNTck, CNTd1 to CNTdk, CNTe1 to CNTek, and CNTf1 to CNTfk is supplied to the gate of one of these pMOSs and nMOSs. For example, the control signal CNTa1 is supplied to the gate of the pMOS 31a1, which is turned on or off according to the value of the control signal CNTa1.

In the example of FIG. 7, three pMOSs and three nMOSs are connected to each inverter; however, the number of each type of MOSs is not limited to three.

Further in the temperature correction delay circuit 21e, a plurality of series circuits, each including a switch and a capacitor, is connected to the output terminal of at least one of the inverters. The switches of these series circuits are individually turned on or off by control signal supplied by the control unit 22, to thereby adjust the load of the inverter.

For example, one end of each switch 32a1, 32b1, 32c1, and 32d1 is connected to the output terminal of the first-stage inverter. The other end of the switch 32a1 is connected to one end of a capacitor 33a1, and the other end of the switch 32b1 is connected to one end of a capacitor 33b1. The other end of the switch 32c1 is connected to one end of a capacitor 33c1, and the other end of the switch 32d1 is connected to one end of a capacitor 33d1. The other ends of the capacitors 33a1, 33b1, 33c1, and 33d1 are grounded. The switches 32a1, 32b1, 32c1, and 32d1 are turned on or off by control signals CNTg1, CNTh1, CONTi1, and CNTj1, respectively, supplied by the control unit 22. One end of each switch 32ak, 32bk, 32ck, and 32dk is connected to the output terminal of the last-stage inverter. The other end of the switch 32ak is connected to one end of a capacitor 33ak, and the other end of the switch 32bk is connected to one end of a capacitor 33bk. The other end of the switch 32ck is connected to one end of a capacitor 33ck, and the other end of the switch 32dk is connected to one end of a capacitor 33dk. The other ends of the capacitors 33ak, 33bk, 33ck, and 33dk are grounded. The switches 32ak, 32bk, 32ck, and 32dk are turned on or off by control signals CNTgk, CNThk, CONTik, and CNTjk, respectively, supplied by the control unit 22.

Note that, in the example of FIG. 7, four series circuits each including a switch and a capacitor are connected to the output terminal of each inverter; however, the number of series circuits is not limited to four.

According to the temperature correction delay circuit 21e described above, the delay time becomes shorter by increasing the number of pMOSs or nMOSs turned on amongst the multiple pMOSs and nMOSs connected to each inverter to thereby increase drive capability. On the other hand, the delay time is set longer by increasing the number of switches turned on amongst the multiple switches connected to the output terminal of each inverter, to thereby increase load.

Note that the above example employs both the circuit for changing the drive capability of each inverter and the circuit for changing the load; however, only one of them may be used to configure the temperature correction delay circuit.

Next described are examples of operations carried out by the ACC circuit 20 according to the second embodiment. The flow of operations here is the same as that of the ACC circuit 11 of the first embodiment, described above using FIGS. 2 and 4.

That is, upon receiving a detection result from the CPM circuit 21, the control unit 22 determines whether the power supply voltage VDD is equal to or less than a threshold (e.g. the threshold voltage VN of FIG. 3), based on the detection result. Then, if determining that the power supply voltage VDD is equal to or less than the threshold, the control unit 22 determines whether the frequency of the clock signal CLK is being reduced. If determining that the frequency of the clock signal CLK is not being reduced, the control unit 22 reduces the frequency of the clock signal CLK to a predetermined level. On the other hand, if determining that the power supply voltage VDD is not equal to or less than the threshold, the control unit 22 determines whether the frequency of the clock signal CLK is being reduced. If determining that the frequency of the clock signal CLK is being reduced, the control unit 22 restores the frequency of the clock signal CLK.

Upon receiving temperature information from the temperature detector 14, the control unit 22 determines whether the temperature has changed, based on the temperature information.

When determining that the temperature has changed, the control unit 22 reads, from the storing unit 23, a temperature correction code corresponding to the temperature indicated by the received temperature information. Then, the control unit 22 changes the delay time of the temperature correction delay circuit 21e according to the read temperature correction code.

With increasing temperature, the delay time of the critical path 21f increases. In this case, based on the read temperature correction code, the control unit 22 increases the number of pMOSs or nMOSs turned on amongst the multiple pMOSs and nMOSs connected to each inverter, for example, in the temperature correction delay circuit 21e illustrated in FIG. 7. This reduces the delay time of the temperature correction delay circuit 21e, which then reduces variation in the overall delay time of the entire CPM circuit 21. It is possible to keep the overall delay time of the entire CPM circuit 21 unchanged by matching the decrease in the delay time of the temperature correction delay circuit 21e to the increase in the delay time of the critical path 21f to thereby offset the chance caused by the temperature rise.

On the other hand, with decreasing temperature, the delay time of the critical path 21f becomes shorter. In this case, based on the read temperature correction code, the control unit 22 increases the number of switches turned on amongst the multiple switches connected to the output terminal of each inverter, for example, in the temperature correction delay circuit 21e illustrated in FIG. 7. This increases the delay time of the temperature correction delay circuit 21e, which then reduces variation in the overall delay time of the entire CPM circuit 21. It is possible to keep the overall delay time of the entire CPM circuit 21 unchanged by matching the increase in the delay time of the temperature correction delay circuit 21e to the decrease in the delay time of the critical path 21f to thereby offset the change caused by the temperature drop.

Figure 8:
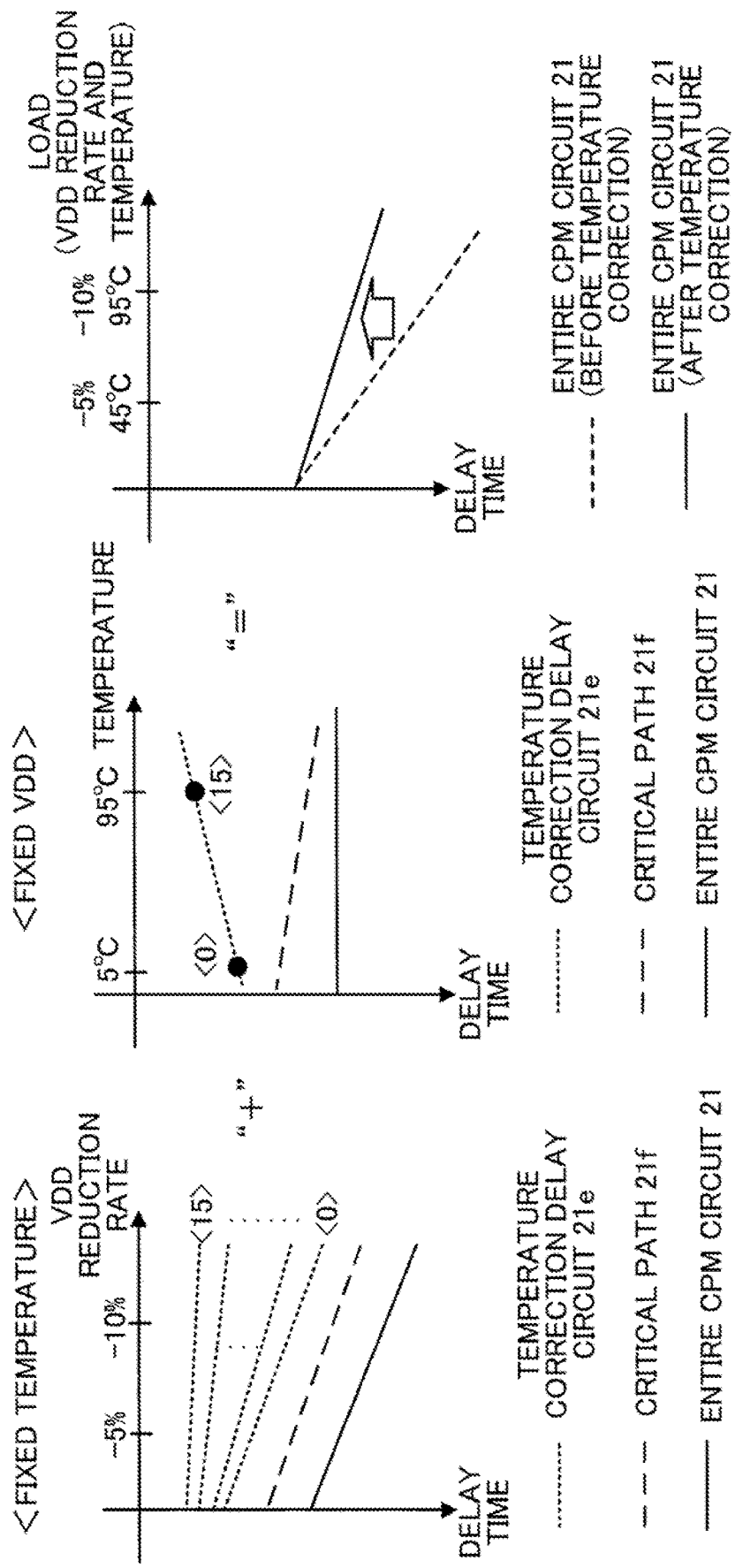
FIG. 8 illustrates an example of cancelling out temperature dependence of a delay time of a CPM circuit.

FIG. 8 illustrates an example of cancelling out the temperature dependence of the delay time of the CPM circuit.

The leftmost part of FIG. 8 depicts the relationship between reduction rate of the power supply voltage VDD and delay times of the temperature correction delay circuit 21e, the critical path 21f, and the entire CPM circuit 21 when the temperature remains constant. Note that, as for the temperature correction delay circuit 21e, the relationship is depicted with respect to each temperature correction code of FIG. 6. As represented in FIG. 8, each delay time increases with increasing reduction rate of the power supply voltage VDD.

The middle part of FIG. 8 depicts the relationship between temperature and delay times of the temperature correction delay circuit 21e, the critical path 21f, and the entire CPM circuit 21 when the power supply voltage VDD remains constant. Note that the delay time of the critical path 21f increases with increasing temperature. On the other hand, the delay time of the temperature correction delay circuit 21e decreases with increasing temperature, as a result of using, for example, the temperature correction code of "<0>" when the temperature is 5° C. and the temperature correction code of "<15>" when the temperature is 95° C. In the example of FIG. 8, the increase in the delay time of the critical path 21f caused by temperature rise is balanced out by the decrease in the delay time of the temperature correction delay circuit 21e. This eliminates the effect of temperature change on the overall delay time of the entire CPM circuit 21, which therefore remains unchanged across the temperature range. That is, the temperature dependence of the delay time of the CPM circuit 21 is cancelled out.

The rightmost part of FIG. 8 depicts the relationship between load (represented by a combination of the VDD reduction rate and temperature) and overall delay times of the entire CPM circuit 21 before and after temperature correction. The delay time of the entire CPM circuit 21 increases with increasing load; however, the delay time after application of temperature correction (i.e., after the temperature dependence of the delay time of the CPM circuit 21 is cancelled out) is free of the influence of temperature change. As a result, the delay time of the entire CPM circuit 21 after the temperature correction exhibits gradual changes against changes in the load compared to when no temperature correction is applied.

As described above, the control unit 22 controls the delay time of the temperature correction delay circuit 21e in such a manner as to exhibit an opposite behavior to a change in the delay time of the critical path 21f induced by temperature. This allows control over the temperature dependence of the overall delay time of the entire CPM circuit 21, which in turn controls temperature dependent variations in a threshold voltage at which ACC is initiated (the threshold voltage VN of FIG. 3). Therefore, greater control accuracy of the control unit 22 in controlling the frequency of the clock signal CLK is provided.

Because a critical path in a semiconductor integrated circuit changes with temperature, it does not suffice to provide a single specific critical path replica in a CPM circuit with no temperature correction. Therefore, it may be considered reasonable to provide, in the CPM circuit, a plurality of critical paths individually corresponding to each temperature value and switch a critical path to be used according to a detected temperature. This, however, leads to increased circuit size. Because the CPM circuit 21 of the ACC circuit 20 according to the second embodiment performs noise detection with control over the temperature dependence of the delay time, only the single critical path 21f is needed.

(Exemplary Calculation of Temperature Correction Codes)

The aforementioned temperature correction codes are calculated, for example, at the time of designing a semiconductor integrated circuit including the ACC circuit 20. In addition, after manufacture of test chips for evaluating the semiconductor integrated circuit, the temperature correction codes may be revised based on results of measuring delay times of the CPM circuit 21 by changing the temperature of the test chips, for example, with the use of a high temperature chamber.

Figure 9:
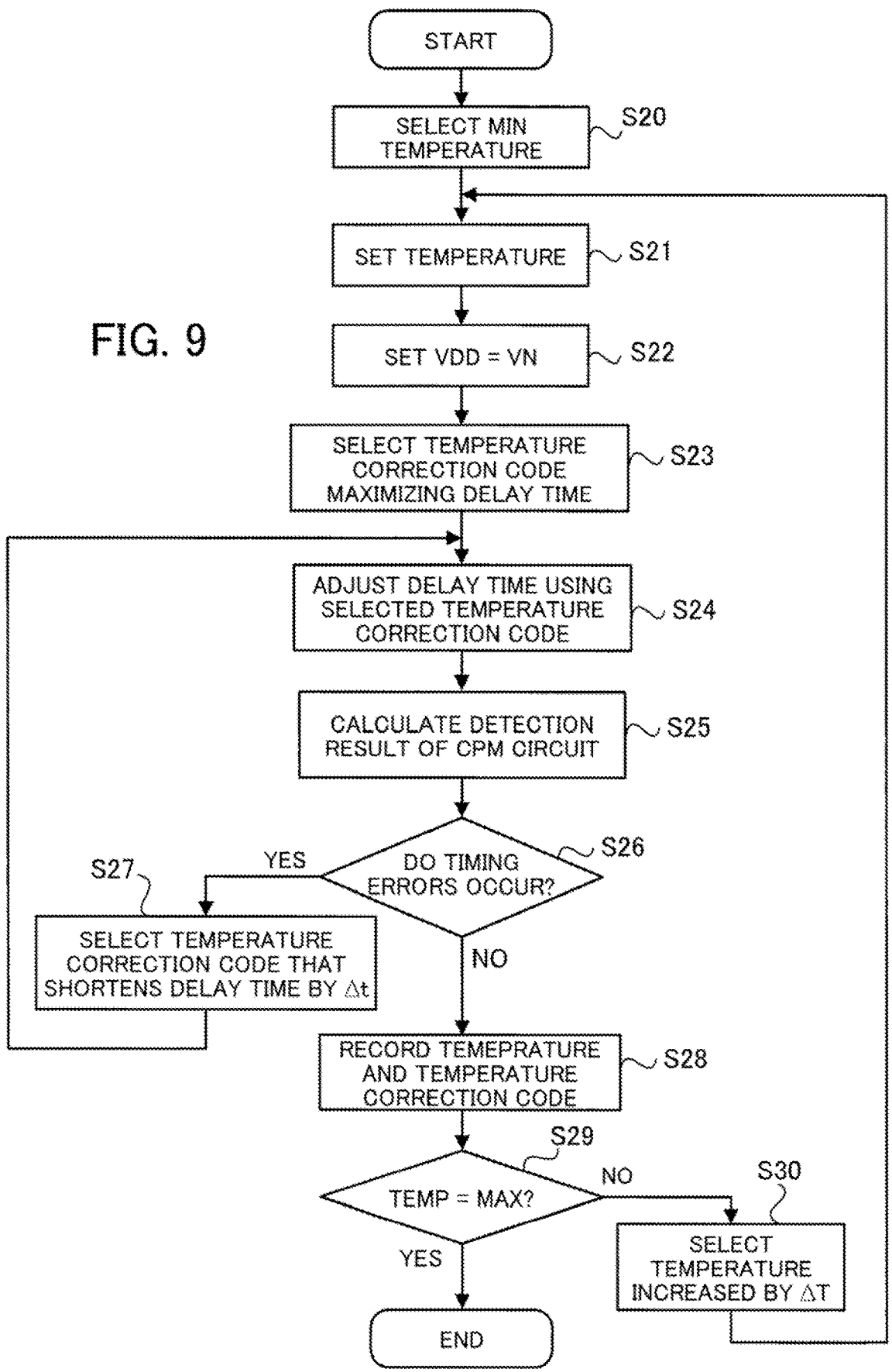
FIG. 9 is a flowchart illustrating an exemplary process flow for calculating temperature correction codes.

FIG. 9 is a flowchart illustrating an exemplary process flow for calculating the temperature correction codes.

The following process is carried out, for example, by a computer that performs a process of designing a semiconductor integrated circuit including the ACC circuit 20.

First, the minimum temperature (e.g. 5° C.) to be detected by the temperature detector 14 is selected (step S20), and then set as the temperature of the semiconductor integrated circuit (step S21). In addition, the power supply voltage VDD of the semiconductor integrated circuit is set to the threshold voltage VN depicted in FIG. 3 (step S22).

Subsequently, a temperature correction code maximizing the delay time of the temperature correction delay circuit 21e of the CPM circuit 21 is selected (step S23), and the delay time of the temperature correction delay circuit 21e is adjusted using the selected temperature correction code (step S24). Then, a detection result of the CPM circuit 21 is calculated (step S25), and based on the detection result, it is determined whether timing errors occur at a circuit unit to which the clock signal CLK is supplied (step S26).

When it is determined that timing errors occur, a temperature correction code that shortens the delay time of the temperature correction delay circuit 21e by $\Delta t$ is selected (step S27), and the process returns to step S24 to be repeated. $\Delta t$ is, for example, the smallest adjustment unit for the delay time of the temperature correction delay circuit 21e.

When it is determined that no timing errors occur, the set temperature and the selected temperature correction code are recorded in the temperature correction code table 23a (step S28). Subsequently, it is determined whether the temperature is the maximum temperature to be detected by the temperature detector 14 (e.g. 95° C.) (step S29). If it is determined that the temperature is not the maximum temperature, a temperature increased by $\Delta T$ is selected (step S30), and the process returns to step S21 to be repeated. If it is determined that the temperature is the maximum temperature, the temperature correction code calculation process ends.

Note that the sequence of the calculation process steps described above is merely an example and may be changed accordingly. For example, in the above example, the minimum temperature is selected first; however, the temperature correction code calculation may be performed by selecting the maximum temperature first and then selecting a temperature sequentially decreased by $\Delta T$ in each iteration.

Note that the temperature correction code table 23a may be written to the storing unit 23 from outside, for example, before the semiconductor integrated circuit including the ACC circuit 20 operates for the first time, via a terminal used to perform a scan test of the semiconductor integrated circuit.

Figure 10:
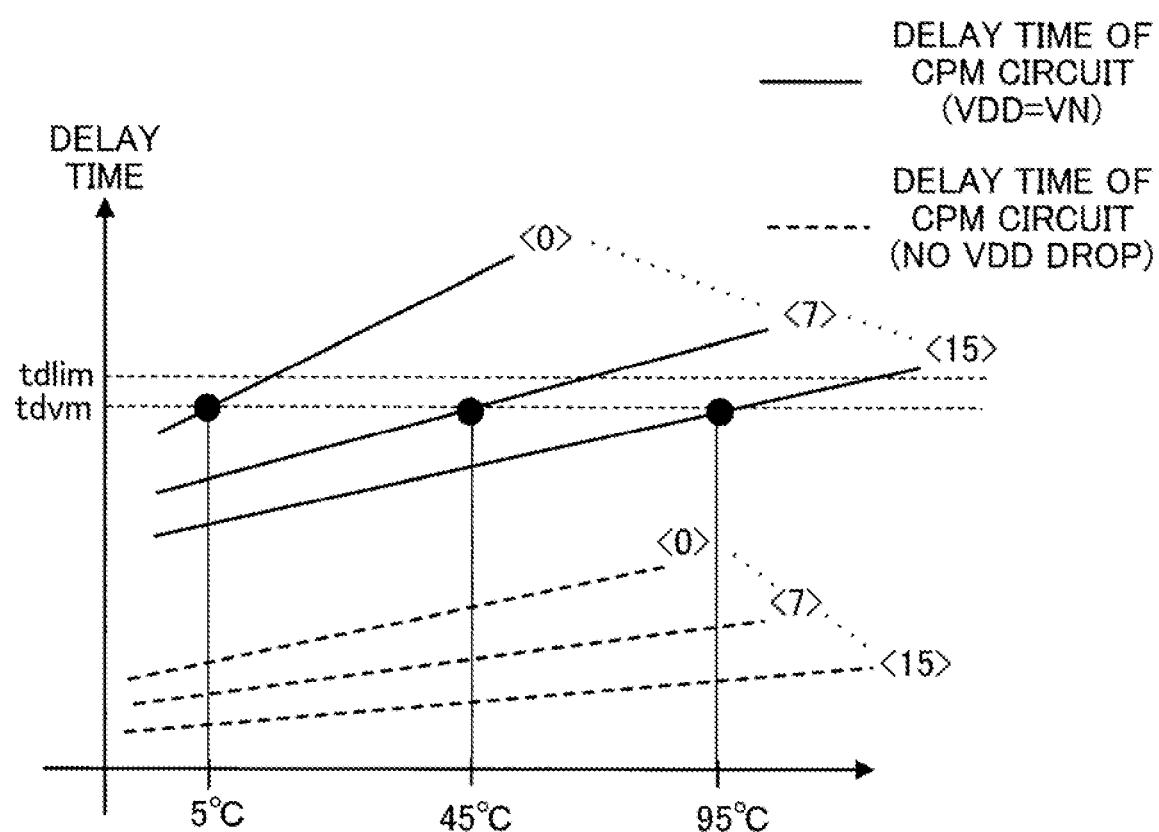
FIG. 10 illustrates an example of delay times of the CPM circuit adjusted with use of calculated temperature correction codes.

FIG. 10 illustrates an example of delay times of the CPM circuit adjusted with the use of calculated temperature correction codes. The horizontal axis is temperature, and the vertical axis is the delay time of the CPM circuit 21.

A delay time tdlim is an upper limit of the delay time determined to cause no timing errors (timing limit), and a delay time tdvm is a delay time at which the power supply voltage VDD is determined to have dropped to the threshold voltage VN.

The temperature correction codes calculated in the process of FIG. 9 are configured such that the delay time of the CPM circuit 21 at each temperature level takes a constant value (the delay time tdlim) when the power supply voltage VDD is at the threshold voltage VN. Then, for example, when the temperature is 5° C., the temperature correction code of "<0>" is used, which is configured such that the delay time of the CPM circuit 21 at 5° C. becomes the delay time tdlim. Similarly, when the temperature is 45° C., a temperature correction code of "<7>" is used, which is configured such that the delay time of the CPM circuit 21 at 45° C. becomes the delay time tdlim. Further, when the temperature is 95° C., a temperature correction code of "<15>" is used, which is configured such that the delay time of the CPM circuit 21 at 95° C. becomes the delay time tdlim. Herewith, it is possible to cancel out the temperature dependence of the delay time of the CPM circuit 21 when the power supply voltage VDD is at the threshold voltage VN.

Even when the temperature changes, the ACC circuit 20 starts reducing the frequency of the clock signal CLK when the delay time of the CPM circuit 21 becomes the delay time tdvm, which is set shorter than the timing limit. In this manner, it is possible to control the occurrence of timing errors.

Note that, as illustrated in FIG. 10, delay times of the CPM circuit 21 at the individual temperature levels exhibit some variability when there is no drop in the power supply voltage VDD; however, the delay times of the CPM circuit 21 in such a case do not involve the control of the clock signal CLK, and thus the variability has little influence.

Note that, in each of the first and second embodiments above, if the control unit 11b and 22 is a processor, the aforementioned operations of the ADD circuit 11 and 20 are implemented by causing the processor to execute a control program.

Such a control program may be recorded in a computer-readable storage medium. Examples of such a computer-readable storage medium include a magnetic disk, an optical disk, a magneto-optical disk, and semiconductor memory. Examples of the magnetic disk are a flexible disk (FD) and a hard disk drive (HDD). Examples of the optical disk are a compact disc CD-recordable (CD-R), CD-rewritable (CD-RW), digital versatile disc (DVD), DVD-R, and DVD-RW. The control program may be recorded on portable storage media and then distributed. In such a case, the program may be executed after being copied from such a portable storage medium to a different storage medium.

Having described aspects of the control circuit, the control method, and the control program based on the embodiments above, they are merely examples and the particular details of these illustrative examples shall not be construed as limitations on the appended claims.

According to one aspect, it is possible to prevent accuracy in controlling the frequency of the clock signal from being lowered due to temperature fluctuations.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A control circuit comprising:
    a noise detection circuit configured to include a first delay circuit which has a propagation delay of a first delay time when a signal propagates therethrough and a second delay circuit which has a propagation delay of a second delay time when the signal propagates therethrough, and configured to output, based on a sum of the first delay time and the second delay time, a detection result indicating magnitude of noise on power supply voltage applied to the first delay circuit and the second delay circuit; and
    a control unit configured to control, based on the detection result, a frequency of a clock signal supplied to a circuit unit to which the power supply voltage is applied and the second delay time in such a manner as to exhibit an opposite behavior to a change in the first delay time induced by temperature.

2. The control circuit according to claim 1, further comprising:
    a storing unit configured to store mapping information indicating mappings between control values used to control the second delay time and temperature values,
    wherein the control unit acquires a temperature reading from a temperature detector, reads from the storing unit a control value corresponding to the acquired temperature reading, and controls the second delay time according to the read control value.

3. The control circuit according to claim 2, wherein:
    the control values are configured such that the sum of the first delay time and the second delay time takes a constant value at each of the temperature values when the power supply voltage is at a certain threshold, and the control unit reduces, based on the detection result, the frequency when the power supply voltage is determined to be equal to or less than the threshold.

4. The control circuit according to claim 1, wherein:
    the first delay time is equal to a delay time of a critical path in the circuit unit.

5. The control circuit according to claim 1, wherein:
    the second delay circuit includes a plurality of inverters connected in series, and a circuit for adjusting drive capability of one of the plurality of inverters based on a first control signal supplied by the control unit or a circuit for adjusting load on one of the plurality of inverters based on a second control signal supplied by the control unit.

6. A control method comprising:
    outputting, by a noise detection circuit including a first delay circuit which has a propagation delay of a first delay time when a signal propagates therethrough and a second delay circuit which has a propagation delay of a second delay time when the signal propagates therethrough, a detection result indicating magnitude of noise on power supply voltage applied to the first delay circuit and the second delay circuit, based on a sum of the first delay time and the second delay time; and
    controlling, by a control unit, based on the detection result, a frequency of a clock signal supplied to a circuit unit to which the power supply voltage is applied and the second delay time in such a manner as to exhibit an opposite behavior to a change in the first delay time induced by temperature.

7. A non-transitory computer-readable recording medium storing therein a control program that causes a computer to execute a process comprising:
    outputting, using a noise detection circuit including a first delay circuit which has a propagation delay of a first delay time when a signal propagates therethrough and a second delay circuit which has a propagation delay of a second delay time when the signal propagates therethrough, a detection result indicating magnitude of noise on power supply voltage applied to the first delay circuit and the second delay circuit, based on a sum of the first delay time and the second delay time; and
    controlling, using a control unit, baaed on the detection result, a frequency of a clock signal supplied to a circuit unit to which the power supply voltage is applied and the second delay time in such a manner as to exhibit an opposite behavior to a change in the first delay time induced by temperature.

* * * * *